US007619675B2

(12) United States Patent
Horii

(10) Patent No.: US 7,619,675 B2
(45) Date of Patent: Nov. 17, 2009

(54) SOLID-STATE IMAGE TAKING APPARATUS WITH PHOTOELECTRIC CONVERTING AND VERTICAL CHARGE TRANSFERRING SECTIONS AND METHOD FOR FABRICATING THE SAME

(75) Inventor: Shinji Horii, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 869 days.

(21) Appl. No.: 11/175,042

(22) Filed: Jul. 6, 2005

(65) Prior Publication Data

US 2006/0007333 A1    Jan. 12, 2006

(30) Foreign Application Priority Data

Jul. 8, 2004    (JP)    ............... 2004-202429

(51) Int. Cl.
*H04N 3/14*    (2006.01)
*H04N 5/335*    (2006.01)

(52) U.S. Cl. ................... 348/311; 257/243; 438/57

(58) Field of Classification Search ............ 348/311, 348/314, 298, 297, 315; 257/E31.038, E31.032, 257/E31.031, E31.001, E31.002, E29.229, 257/E27.151, E29.133, 466, 465, 461, 445, 257/444, 242, 230, 229, 224, 222, 220, 215, 257/214, E31.084; 250/208.1, 214.1; 438/60, 438/57

See application file for complete search history.

(56) References Cited

U.S. PATENT DOCUMENTS 5,029,321 A *  7/1991  Kimura ............... 257/243
5,051,798 A *  9/1991  Kimura ............... 257/229
5,086,010 A *  2/1992  Kimura ............... 438/75
5,114,865 A *  5/1992  Kimura ............... 438/79

FOREIGN PATENT DOCUMENTS

JP    2-267966 A    11/1990
JP    5-137072 A    6/1993

\* cited by examiner

*Primary Examiner*—Timothy J Henn
*Assistant Examiner*—Nelson D. Hernández Hernández
(74) *Attorney, Agent, or Firm*—Nixon & Vanderhye P.C.

(57) ABSTRACT

A solid-state image pickup apparatus includes one or a plurality of photoelectric converting sections for photoelectric converting incident light into a signal charge on a semiconductor substrate, and a vertical charge-transferring section for charge-transferring the signal charge photoelectric converted at the photoelectric converting section, in which the vertical charge-transferring section is located under the photoelectric converting section on the side of the semiconductor substrate.

10 Claims, 17 Drawing Sheets

SOLID-STATE IMAGE TAKING APPARATUS WITH PHOTOELECTRIC CONVERTING AND VERTICAL CHARGE TRANSFERRING SECTIONS AND METHOD FOR FABRICATING THE SAME

This Nonprovisional application claims priority under 35 U.S.C. §119(a) on Patent Application No. 2004-202429 filed in Japan on Jul. 8, 2004, the entire contents of which are hereby incorporated by reference.

BACKGROUND

1. Field

The present disclosure relates to a solid-state image pickup apparatus of a Charge Coupled Device (CCD) type which is used as an image taking section of, for example, video cameras and digital still cameras, and a fabrication method for the same, and in particular, to a solid-state image pickup apparatus of a CCD type which is intended to have a higher image quality and a smaller size, and a fabrication method for the same.

2. Description of the Related Art

In recent years, solid-state image pickup apparatuses of CCD type are widely used instead of image pickup tubes since they have characteristics that they are lighter and have longer lives compared to the image pickup tubes. Particularly, recently, such solid-state image pickup apparatuses of CCD type are widely used not only in video cameras for household use, video cameras for broadcasting and digital still cameras, but also in cell-phones, various household electric appliances which are referred to as digital electric appliances, and the like.

FIG. 14 is a cross-sectional view showing an exemplary basic structure of one pixel of a conventional solid-state image pickup apparatus.

As shown in FIG. 14, a solid-state image pickup apparatus 100 includes: a photodiode 102 formed of an n-type diffusion layer which is provided on a p-type S1 substrate 101 as a semiconductor substrate: a vertical CCD channel 103 formed of an n-type region which is provided adjacent to the photodiode 102 on one side; and an overflow drain 104 provided on the other side of the photodiode 102. Above a region between the photodiode 102 and the vertical CCD channel 103, a transfer electrode 106 which also serves as a readout electrode is provided via a gate insulation film 105. Above a region between the photodiode 102 and the overflow drain 104, an overflow potential control electrode 107 is provided via the gate insulation film 105. A planarizing insulation film 108 is provided to cover the substrate. Thereon, a light shielding film 109 which has an opening above the photodiode 102 is further provided.

In the above-described structure, incident light hr passes through the opening of the light-shielding film 109 and enters the photodiode 102, thereby photoelectric converted, and stored as a signal charge. The signal charge is transported from the photodiode 102 to the vertical CCD channel 103 through a field shift gate 110 under the transfer electrode 106, and is transferred within the vertical CCD channel 103 sequentially. An excess charge caused by strong incident light hr is discharged towards the overflow drain 104 via an overflow gate 111 under the overflow potential control electrode 107.

FIG. 15 is a cross-sectional view showing an exemplary structure of one pixel of another conventional solid-state image pickup apparatus. In FIG. 15, components having the same functions and effects as those in FIG. 14 are denoted by the same reference numerals.

As shown in FIG. 15, a solid-state image pickup apparatus 120 includes a p-type well diffusion layer loin provided on an n-type S1 substrate 101A which is thin under a photodiode 102 and thick under a vertical CCD channel 103. An excess charge caused by strong incident light hr is to be discharged through the well diffusion layer 101B to the substrate 101A. Such a structure to discharge an excess charge is called a vertical overflow drain structure.

FIG. 16 is a diagram showing a potential in X-Y direction of FIG. 14.

In FIG. 16, the horizontal axis indicates positions in X-Y direction, and the vertical axis indicates potential. The solid line represents a potential when a signal is stored and the broken line represents a potential when a signal is readout. The height of arrow A represents a potential difference between a potential at the field shift gate 110 during reading out and a potential at the overflow gate 111.

An excess charge when a signal is charged, represented by the solid line, is to be discharged towards the overflow drain 104 over a potential at the overflow gate 111.

FIG. 17 is a graph showing an input/output characteristic of the pixel portion of FIG. 14. In FIG. 17, the horizontal axis indicates incident light intensity, and the vertical axis indicates output current.

As shown in FIG. 17, when the incident light is weak, an input/output characteristic curve of an output current with respect to the incident light intensity follows a straight line 130 initially, and then the input/output characteristic curve bends around as shown by a solid line 132 when it exceeds a certain incident light intensity 131. The output current is suppressed and compressed.

This is because a part of the charges caused by the incident light exceeds the potential at the overflow gate 111 and is discharged toward the overflow drain 104. A range of the straight line 130 in which the input/output characteristic curve is linear is decided by potential difference A between the potential of reading out of the field shift gate 110 and the potential of overflow gate 111.

However, since the field shift gate 110 and the overflow gate 111 are completely different from each other, potential differences A are different for each of the pixels. Thus, the range of the straight line 130 is small in a pixel having a small potential difference A, and the input/output characteristic curve becomes the curve represented as 132A in FIG. 17. On the other hand, the range of the straight line 130 is large in a pixel having a large potential difference A, and the input/output characteristic curve becomes the curve represented as 132B in FIG. 17. With such a variance in ranges, display unevenness occurs on a reproduced screen. Thus, they cannot be used. Accordingly, a range that can be used is limited to the range indicated by arrow B in FIG. 17 (a range of the straight line 130 to the input/output characteristic curve 132A), and a dynamic range becomes small.

As described above, the conventional structure has a problem that display unevenness occurs on a reproduced screen since there is a potential difference A between the field shift gate 110 and the overflow gate 111 for each of the pixels.

As a means for solving the above-described problem, for example, Japanese Laid-Open Publication No. 05-137072 discloses a solid-state image pickup apparatus having a structure as shown in FIG. 18.

FIG. 18 is a cross-sectional view showing an exemplary structure of one pixel of yet another conventional solid-state image pickup apparatus. In FIG. 18, components having the same functions and effects as those in FIGS. 14 and 15 are denoted by the same reference numerals.

As shown in FIG. 18, a solid-state image pickup apparatus 140 includes an overflow drain 104 provided on a side of a vertical CCD channel 103 which is opposite to a side of a photodiode 102, from which a signal charge is to be read out from incident light hr, unlike the conventional solid-state image pickup apparatus 100 shown in FIG. 14.

In such a solid-state image pickup apparatus 140, the incident light h which passes through an opening 109a of the light-shielding film 109 is photoelectric converted by the photodiode 102 and is stored as a signal charge. The signal charge passes through a field shift gate 110 under a transfer electrode 106, transported from the photodiode 102 to a vertical CCD channel 103, and transferred within the vertical CCD channel 103 sequentially.

An excess charge caused by strong incident light hr is discharged from the vertical CCD channel 103 towards an overflow drain 104 through the field shift gate 110, an embedded channel of the vertical CCD channel 103, and an overflow gate 111.

In such a structure, the incident light intensity 131 where the input/output curve bends around as shown in FIG. 17 is determined based on only a potential at the field shift gate 111 when a charge is stored. Thus, a saturation characteristic can be evened substantially. Accordingly, output unevenness among pixels due to discharging an excess charge can be made smaller, and a dynamic range can be expanded.

However, in any of the conventional structures a s described above, the photodiode 102 for photoelectric converting the incident light hr and generating a signal charge, and the transfer electrode 106 and the vertical CCD channel 103 for transferring the generated signal charge are arranged on a two-dimensional plane on the semiconductor substrate. Thus, larger light receiving area cannot be secured. Accordingly, it is difficult to aim at improving image quality by photoelectric converting more incident light hr.

As another method for improving image quality, increasing an amount of a signal charge which can be stored in the vertical CCD channel 103 for storing the signal charge which is photoelectric converted by the photodiode 102. This becomes possible by increasing an area of the vertical CCD channel 103 and a voltage to be applied to the transfer electrode 106 of the vertical CCD channel 103. However, when the area of the vertical CCD channel 103 is increased, the area occupied by the vertical CCD channel 103 on the semiconductor substrate becomes large, and thus, the light receiving area of the photodiode 102 has to be reduced. Accordingly, the light intensity of the incident light hr for photoelectric conversion at the photodiode 102 becomes small, and it becomes difficult to aim at improving the image quality. When the voltage is applied to the transfer electrode of the vertical CCD channel 103, the operating voltage in the semiconductor device becomes large. This is not preferable in terms of power consumption and miniaturization of solid-state image pickup apparatuses.

As described above, with the structures of the conventional solid-state image pickup apparatuses 100, 120, 140 in which the photodiode 102, the transfer electrode 106 and the vertical CCD channel 103 are arranged on a two-dimensional plane on the semiconductor substrate it is difficult to increase the light intensity of the incident light hr to the photodiode 102, and to increase a storage amount for the signal charge which is photoelectric converted. Thus, it is difficult to aim at improving the image quality of the solid-state image pickup apparatus 100, 120, and 140.

SUMMARY

According to one aspect of the present invention, a solid-state image pickup apparatus includes: one or a plurality of photoelectric converting sections provided on a semiconductor substrate for photoelectric converting incident light into a signal charge; and a vertical charge-transferring section for charge-transferring the signal charge photoelectric converted and stored at the photoelectric converting section, wherein the vertical charge-transferring section is located under the photoelectric converting section on the side of the semiconductor substrate.

In one embodiment of the present invention, the solid-state image pickup apparatus further includes at least one protruding semiconductor layer of a convex shape provided on the semiconductor substrate, wherein the vertical charge-transferring section is provided on all or part of a side wall of the protruding semiconductor layer, and the photoelectric converting section is provided on a top surface of the protruding semiconductor layer.

In one embodiment of the present invention, the vertical charge-transferring section is located along a direction of a plurality of the photoelectric converting sections which are aligned in a vertical direction.

In one embodiment of the present invention, the solid-state image pickup apparatus further includes an overflow drain provided in the vertical charge-transferring section on the side of the semiconductor substrate, wherein the overflow drain is configured to discharge an excess charge generated at the photoelectric converting section via the vertical charge-transferring section.

In one embodiment of the present invention, the overflow drain is provided on at least one of a top surface of the semiconductor substrate and a side wall of the protruding semiconductor layer.

In one embodiment of the present invention, the solid-state image pickup apparatus further includes a charge-transfer electrode for controlling charge-transfer of the vertical charge-transferring section, which is provided over the vertical charge-transferring section and a region between the vertical charge-transferring section and the photoelectric converting section with an insulation film interposed therebetween; and an overflow potential control electrode for controlling charge discharging to the overflow drain, which is provided over a region between the vertical charge-transferring section and the overflow drain with an insulation film interposed therebetween.

In one embodiment of the present invention, the side wall of the protruding semiconductor layer has a step, and the charge-transfer electrode and the overflow potential control electrode are respectively provided on the side wall having the step.

According to another aspect of the present invention, a method for fabricating a solid-state image pickup apparatus is provided. The solid-state image pickup apparatus includes a plurality of photoelectric converting sections provided on a semiconductor substrate for photoelectric converting incident light into a signal charge; and a vertical charge-transferring section located under the photoelectric converting sections on the side of the semiconductor substrate for charge-transferring the signal charge photoelectric converted and stored at the photoelectric converting sections. The method includes the steps of: forming at least one protruding semiconductor layer of a convex shape on the semiconductor substrate; forming a vertical charge-transferring section on all or part of a side wall of the protruding semiconductor layer; forming a charge-transfer electrode which us formed of a conductive film on all or part of the side wall of the protruding semiconductor layer; and forming the photoelectric converting sections on a top surface of the protruding semiconductor layer.

According to another aspect of the present invention, a method for fabricating a solid-state image pickup apparatus is provided. The solid-state image pickup apparatus including a plurality of photoelectric converting sections provided on a semiconductor substrate for photoelectric converting incident light into a signal charge; a vertical charge-transferring section located under the photoelectric converting sections on the side of the semiconductor substrate for charge-transferring the signal charge photoelectric converted and stored at the photoelectric converting sections; and an overflow drain located in the vertical charge-transferring section on the side of the semiconductor substrate, wherein the overflow drain is configured to discharge an excess charge generated at the photoelectric converting section via the vertical charge-transferring section. The method includes the steps of: forming at least one protruding semiconductor layer of a convex shape on the semiconductor substrate; forming an overflow potential control electrode which is formed of a conductive film on all or part of a side wall of the protruding semiconductor layer; forming a vertical charge-transferring section on all or part of the side wall of the protruding semiconductor layer; forming the overflow drain on the semiconductor substrate or the protruding semiconductor layer; forming a charge-transfer electrode which is formed of a conductive film on all or part of the side wall of the protruding semiconductor layer; and forming the photoelectric converting sections on a top surface of the protruding semiconductor layer.

According to another aspect of the present invention, a method for fabricating a solid-state image pickup apparatus is provided. The solid-state image pickup apparatus includes a plurality of photoelectric converting sections provided on a semiconductor substrate for photoelectric converting incident light into a signal charge; a vertical charge-transferring section located under the photoelectric converting sections on the side of the semiconductor substrate for charge-transferring the signal charge photoelectric converted and stored at the photoelectric converting sections; and an overflow drain located in the vertical charge-transferring section on the side of the semiconductor substrate, wherein the overflow drain is configured to discharge an excess charge generated at the photoelectric converting section via the vertical charge-transferring section. The method includes the steps of: forming at least one protruding semiconductor layer of a convex shape on the semiconductor substrate; forming an oxide film on the semiconductor substrate and protruding semiconductor layer; introducing a predetermined impurities to a side wall of the protruding semiconductor layer to adjust an impurity concentration of an overflow gate portion; forming an overflow potential control electrode at a predetermined position on the oxide film; respectively forming the vertical charge-transferring section, the overflow drain, and a region to be photoelectric converting sections by ion implantation to the side wall of the protruding semiconductor layer through the oxide film; embedding the overflow potential control electrode with the insulation film; forming a charge-transfer electrode at a predetermined position on the oxide film which is not buried by the insulation film; introducing predetermined impurities on the side wall of the protruding semiconductor layer to form a field shift gate in a region between the vertical charge-transferring section and the region to be photoelectric converting sections; and introducing predetermined impurities to a top surface of the protruding semiconductor layer to form the photoelectric converting sections.

Thus one or more aspect of the invention described herein makes possible the advantages of providing a solid-state image pickup apparatus and a fabrication method thereof which can increase a light receiving area of a photodiode to increase an incident light intensity, and at the same time increase an area of a vertical CCD channel to increase storage amount of signal charge, thereby improving the image quality.

In view of the above-described structure, effects of one or more aspects of the present invention will be described below.

In the conventional technique, photodiodes as photoelectric converting sections and a vertical CCD channel as a vertical charge-transferring section are two-dimensionally arranged on a semiconductor substrate surface. Thus, it was difficult to achieve a good balance between increasing a light receiving area of the photodiode to increase an incident light intensity and increasing an area of the vertical CCD channel to increase the storage amount of a signal charge.

Therefore, in one or more aspects of the present invention, the vertical CCD channel is located under the photodiode on the side of the semiconductor substrate to arrange the photodiodes and the vertical CCD channel three dimensionally in a direction perpendicular to a semiconductor substrate surface thus, it is not necessary to reduce the area of the vertical CCD channel even when the light receiving area of the photodiode is increased in order to increase the intensity of the incident light to be photoelectric converted. Accordingly, it becomes possible to increase the light receiving area of the photodiodes to increase the incident light intensity to be photoelectric converted, and at the same time, to increase the area of the vertical CCD channel to increase the storage amount of the signal charge. Thus, it becomes possible to aim at improving the image quality of the solid-state image pickup apparatus.

Specifically, for example, a protruding semiconductor layer of a convex shape is provided on the semiconductor substrate, and a photodiode is provided on an upper surface thereof and the vertical CCD channel on a side wall. In this way, it becomes possible to increase the light receiving area of the photodiodes and increase the area of the vertical CCD channel at the same time. In such a case, it is also possible to increase the area of the vertical CCD channel to further increase the storage amount of the signal charge by further increasing the height of the side wall.

Further, the photodiodes, the vertical CCD channel and the overflow drain are arranged in a direction perpendicular with respect to the substrate surface. The excess charge is discharged from the overflow drain via the vertical CCD channel. In this structure, compared to the conventional structure where the field shift gate of the vertical CCD channel and the overflow gate are provided on both sides of the photodiode, output unevenness among pixels can be made smaller and a dynamic range can be made broader.

For example, the overflow drain may be provided on the semiconductor substrate side, on the side of a side wall of the protruding semiconductor layer, or on both. Further, a stop portion m ay be provided on the side wall of the protruding semiconductor layer, and the transfer electrode and the overflow potential control electrode are respectively provided on the side wall via the step portion.

As described above, the photodiodes as photoelectric conversion sections and the vertical CCD channel as a vertical charge-transferring section are three-dimensionally arranged in a direction perpendicular with respect to the semiconductor substrate surface. Thus, even when the light receiving area of the photodiode is increased in order to increase the light intensity of the incident light to be photoelectric converted, the light receiving area of the photodiodes can be increased to increase the incident light intensity, and at the same time, the area of the vertical CCD channel can be increased to increase the storage amount of the signal charge, without reducing the area of the vertical CCD channel. Accordingly, a solid-state image pickup apparatus with an improved image quality can be obtained.

These and other advantages of the present invention will become apparent to those skilled in the art upon reading and understanding the following detailed description with reference to the accompanying figures.

DETAILED DESCRIPTION

Hereinafter, embodiments of the solid-state image pickup apparatus and fabrication method thereof according to one or more aspects of the present invention will be described with reference to the drawings.

Figure 1:
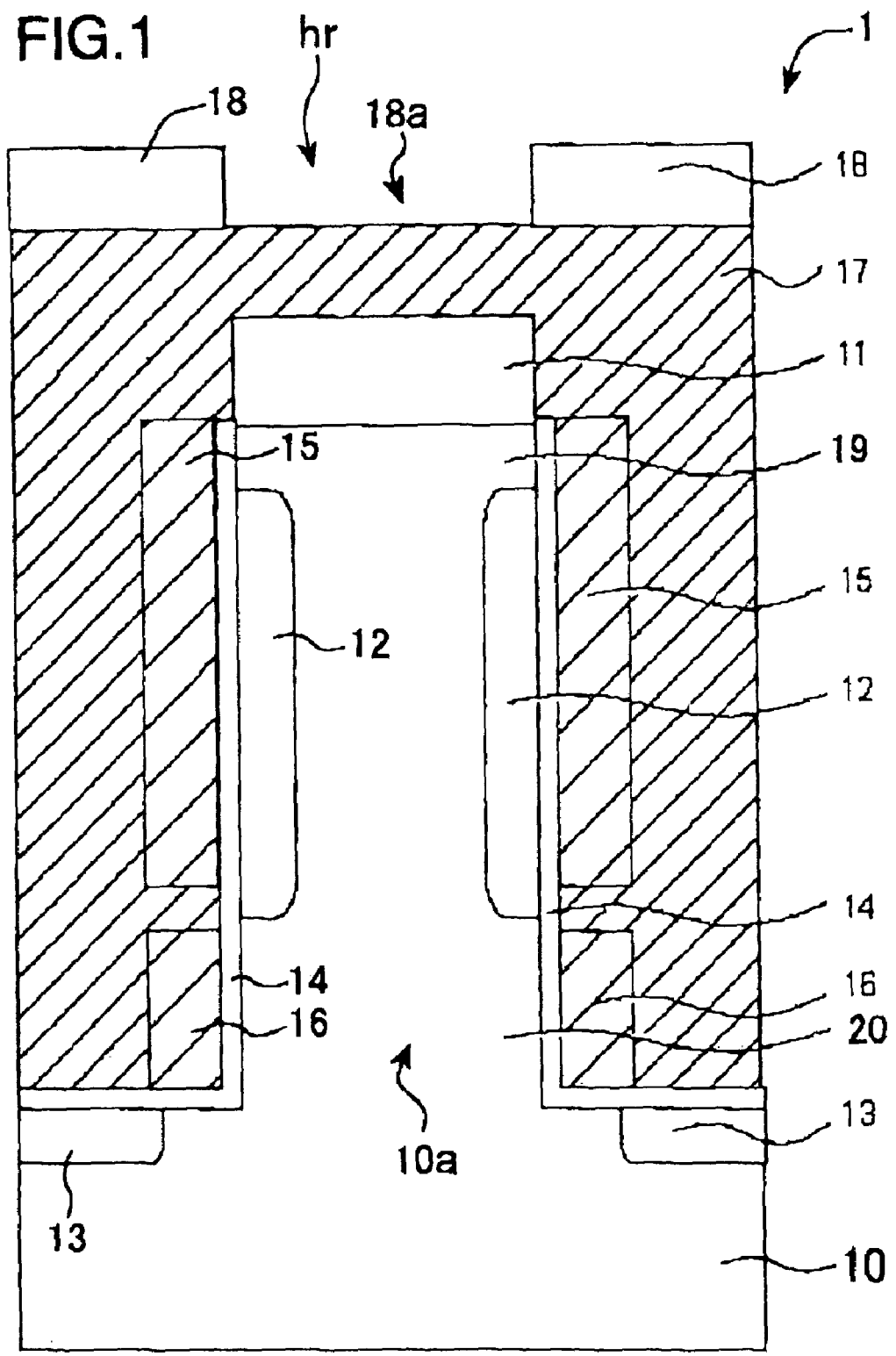
FIG. 1 is a cross sectional view showing an exemplary structure of one pixel in an embodiment of the solid-state image pickup apparatus according to the present invention.

FIG. 1 is a cross sectional view showing an exemplary structure of one pixel in an embodiment of a solid-state image pickup apparatus. In this embodiment, a p-type silicon (Si) substrate is used for the solid-state image pickup apparatus.

As shown in FIG. 1, a solid-state image pickup apparatus 1 of this embodiment includes: a protruding semiconductor layer 10a having a convex shape which is provided on a p-type silicon substrate 10 as a semiconductor substrate; and a photodiode 11 which is provided on at least a part of an upper surface of the protruding semiconductor layer 10a as a photoelectric conversion section formed of an n-type diffusion layer.

Further, a vertical CCD channel 12 as a vertical charge-transferring section is provided on at least apart of a side wall of the protruding semiconductor layer 10a. On at least a part of the vertical CCD channel 12, for example, a gate insulation film 14 formed by thermal oxidation is provided. Further, a charge-transfer electrode 15 of the vertical CCD channel 12 formed of, for example polycrystalline silicon which is provided so as to cover at least a part of the gate insulation film 14.

Further, an overflow drain 13 is provided on at least a part of the p-type silicon substrate 10. An overflow potential control electrode 16 formed of, for example, poly crystalline silicon is provided on at least a part of a side wall of the protruding semiconductor layer 10a via the gate insulation film 14.

An insulation film 17 for planarizing is provided so as to cover the structure. On the insulation film 17, a light-shielding film 18 having an opening 18a above the photodiode 11 is further provided.

A plurality of the photodiodes 11 are arranged in a two dimension (or arranged in a matrix) on a substrate surface of the p-type silicon substrate 10 as the semiconductor substrate in a longitudinal direction (a direct ion perpendicular to a page of FIG. 1) and lateral direction (a horizontal direction). The vertical CCD channel 12 and the charge-transfer electrode 15 as the vertical charge-transferring section is arranged along the arrangement of the plurality of photodiode 11 aligned in a perpendicular direction (longitudinal direction which is perpendicular to a page of FIG. 1), which correspond to respective vertical charge-transferring sections.

In this way, the photodiode 11 and the vertical CCD channels 12 are three-dimensionally arranged in the direction perpendicular to the semiconductor substrate surface. Thus, even when the light receiving area of the photodiode 11 is increased for increasing the light intensity of the incident light which is to be photoelectric converted, it is not necessary to reduce the area of the vertical CCD channel 12.

A method for fabricating the solid-state image pickup apparatus 1 of this embodiment which has the above-described structure will be described in detail with reference to FIG. 2 to 11. FIGS. 2 to 11 are cross-sectional views for illustrating fabrication steps for the solid-state image pickup apparatus of this embodiment.

Figure 2:
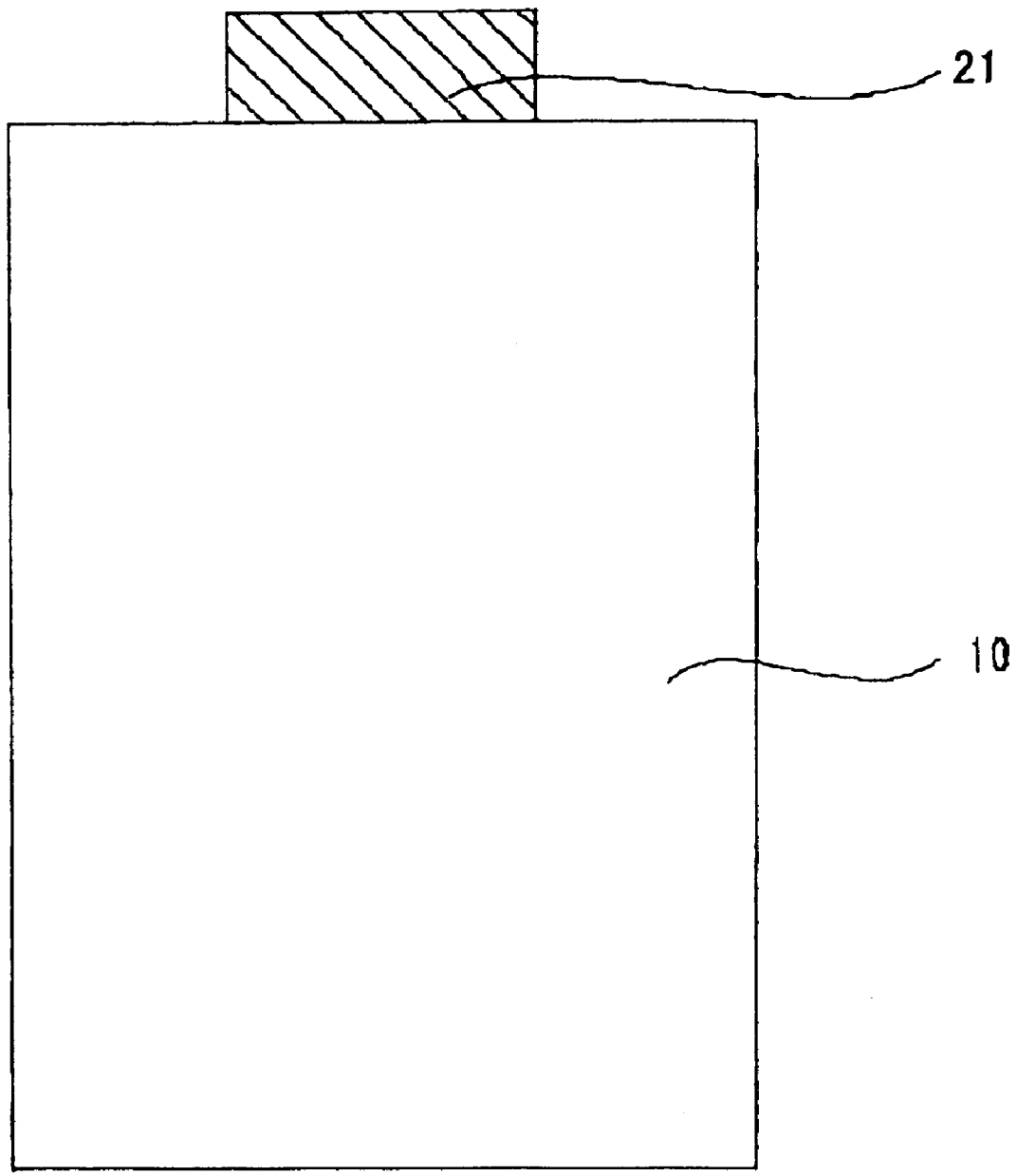
FIG. 2 is a cross sectional view illustrating a first insulation film forming step of a process to fabricate the solid-state image pickup apparatus.

First, as a semiconductor substrate, for example, the p-type silicon substrate 10 is used. On a surface thereof, for example, a silicon oxide film is deposited as a first insulation film which is to be a mask layer so as to have a thickness of 200 to 2000 nm. With a known photolithography technique, a resist film (not shown) patterned on the silicon oxide film is used as a mask, and the silicon oxide film etched with reactive ion etching to form a first insulation film 21 as shown in FIG. 2.

The first insulation film 21 is not limited to the silicon oxide film. It may be, for example, a silicon nitride film, or a conductive film. Alternatively, it may be a laminated film formed of two or more types of materials. The material of the first insulation film 21 may be any kind of material as long as it cannot be etched or it has an etching rate slower than that of silicon when reactive etching of the p-type silicon substrate 10 is performed, and is not particularly limited.

Figure 3:
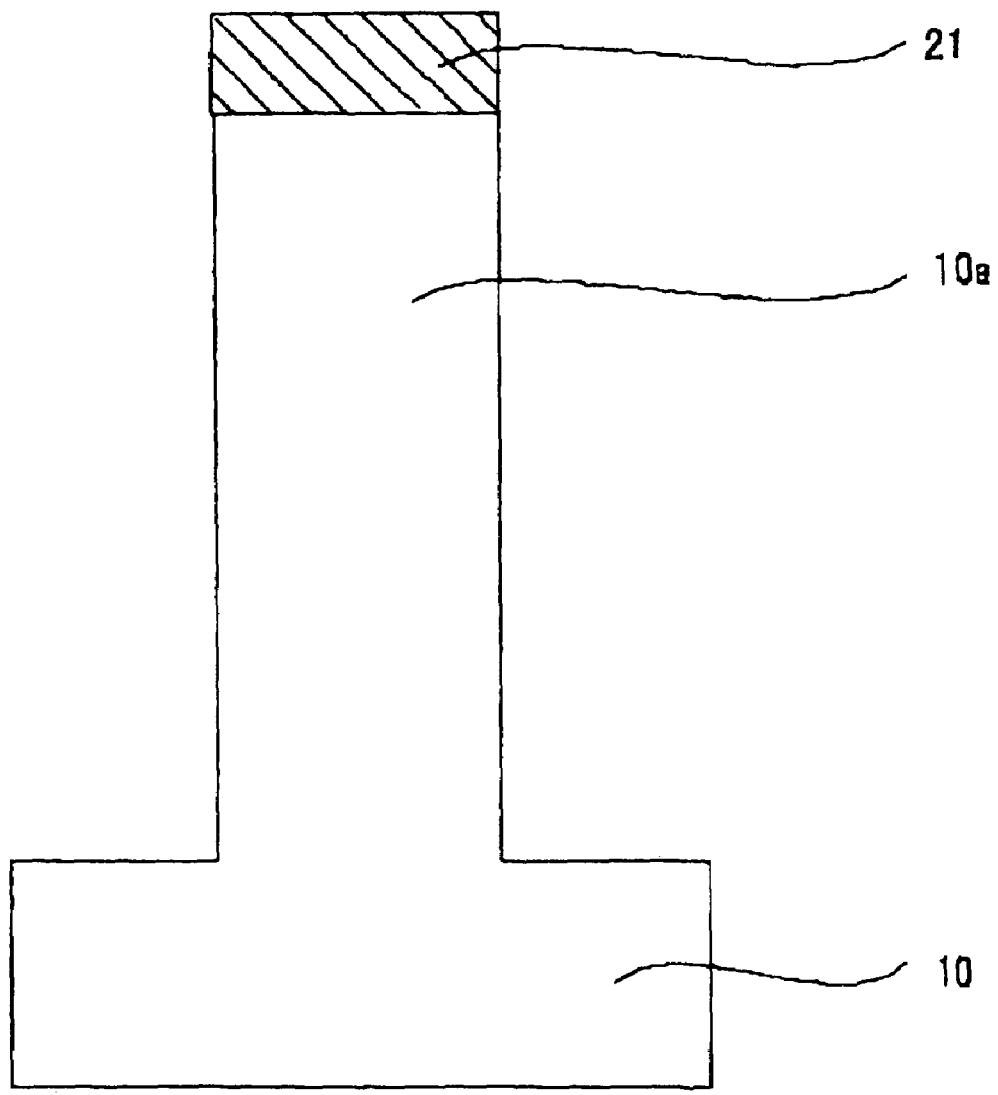
FIG. 3 is a cross sectional view illustrating a protruding semiconductor layer forming step of the process to fabricate the solid-state image pickup apparatus.

Next, the first insulation film 21 is used as a mask layer, and the p-type silicon substrate 10 which is a semiconductor substrate is etched for a thickness of 1 to 5000 nm with reactive etching. After the etching, the first insulation film 21 is selectively removed to form the protruding semiconductor layer 10a as shown in FIG. 3.

Figure 4:
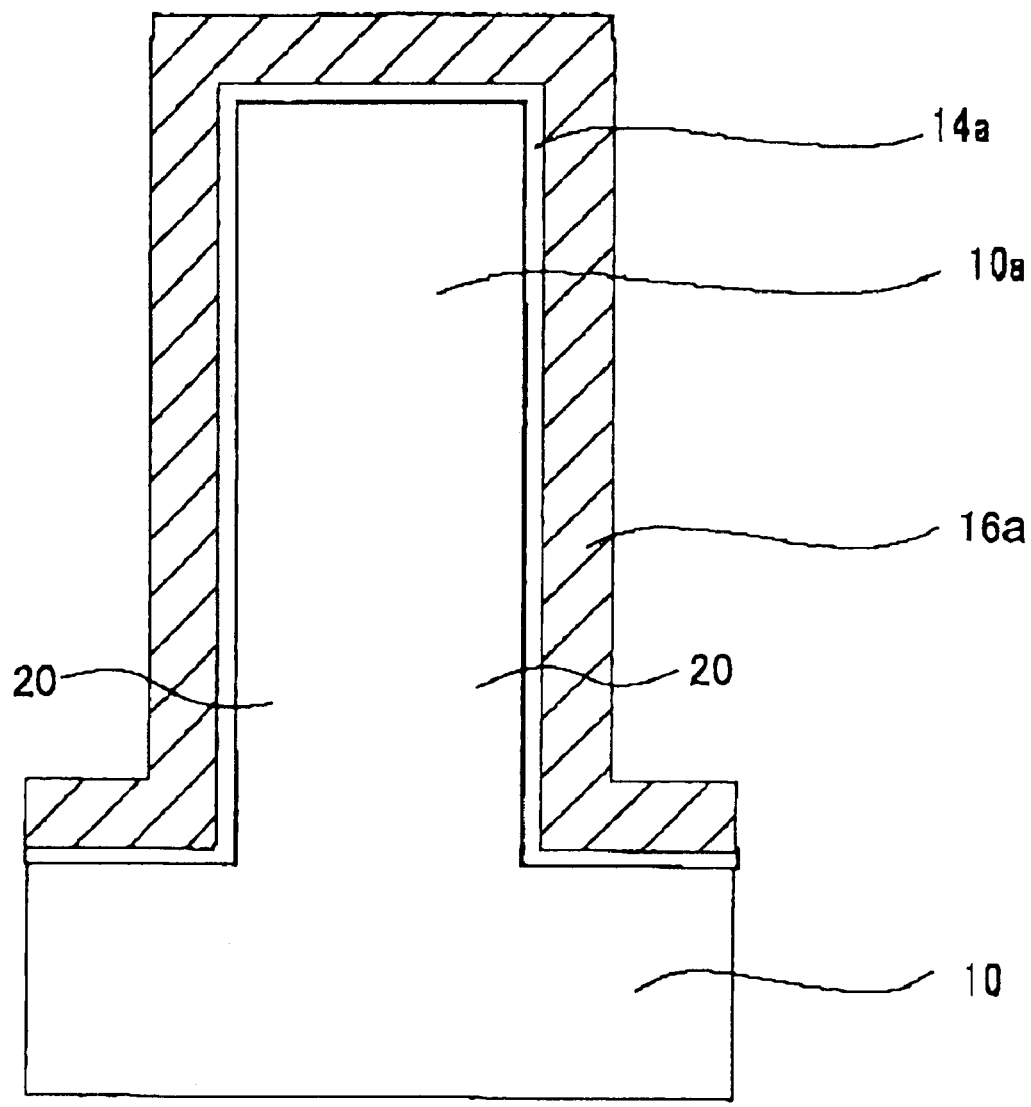
FIG. 4 is a cross sectional view illustrating a second insulation film and first conductive layer forming step of the process to fabricate the solid-state image pickup apparatus.

Then, by subjecting the p-type silicon substrate 10 and protruding semiconductor layer 10a to, for example, thermal oxidization, the silicon oxide film 14a which is to be a second insulation film is formed as shown in FIG. 4 is formed. The silicon oxide film 14a which is to be a second insulation film may be formed by, for example, a deposition using a CVD method, and a forming method is not particularly limited.

Thereafter, impurities are introduced to a side wall of the protruding semiconductor layer 10a to adjust an impurity concentration of a portion which is to be the overflow gate 20. For example, boron is intruded by an ion implantation method from a direction inclined by 0° to 60° at an implantation energy of 5 to 100 keV in a dose amount of about $1\times10^{10}$ to $1\times10^{17}/cm^2$. Impurity introduction into the overflow gate 20 is not necessarily performed here, and the presence/absence of impurity introduction and the implantation method are not particularly limited as long as a desired impurity concentration can be obtained.

Then, as shown in FIG. 4, as a first conductive layer for example, a polycrystalline silicon film 16a is deposited on the silicon oxide film 14a so as to have a thickness of about 20 to 200 nm. Next, by an ion implantation method for example, impurities are introduced to the polycrystalline silicon film 16a. For example, arsenic or phosphorous is introduced at an implantation energy of 5 to 100 keV in a dose amount of $1\times10^{12}$ to $1\times10^{17}/cm^2$. The method for introducing impurities to the polycrystalline silicon film 16a which is to be the first conductive layer is not limited to ion implantation, and may be other methods such as introducing impurities during deposition. Further, it is not necessary that impurities are introduced immediately after the polycrystalline silicon film 16a is deposited. They may be introduced in a later process.

Figure 5:
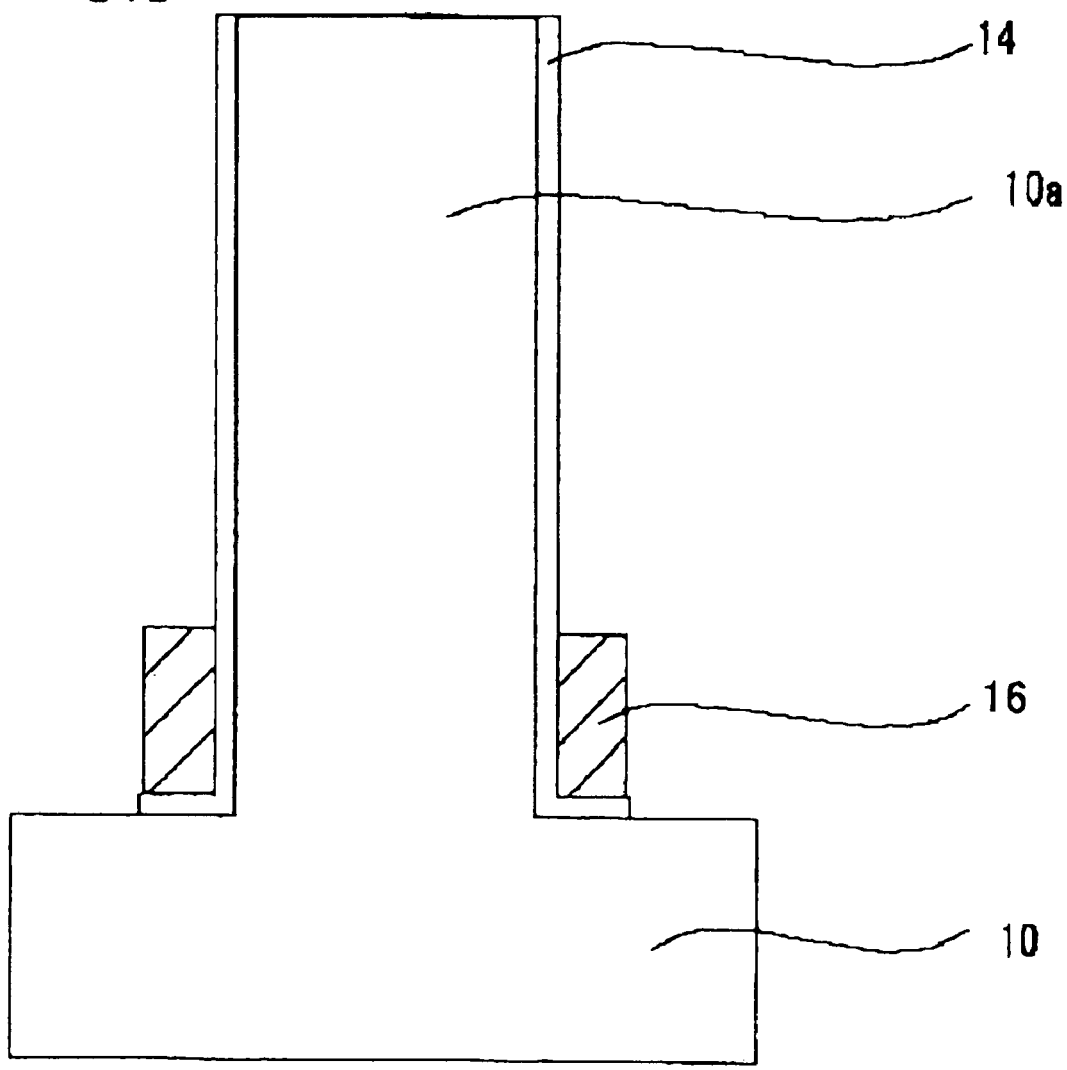
FIG. 5 is a cross sectional view illustrating an overflow potential control electrode forming step of the process to fabricate the solid-state image pickup apparatus.

Next, anisotropic etching of the polycrystalline silicon film 16a is performed by, for example, a reactive ion etching method to form an overflow potential control electrode 16 as shown in FIG. 5. The etching method for the polycrystalline silicon film 22 is not limited to the reactive ion etching method. Any method can be used as long as a desired shape can be achieved. For example, a silicon oxide film, a silicon nitride film or the like may be deposited, an anisotropic etching may be performed to form a hard mask, and then, an isotropic etching method such as CDE may be used for etching.

Figure 6:
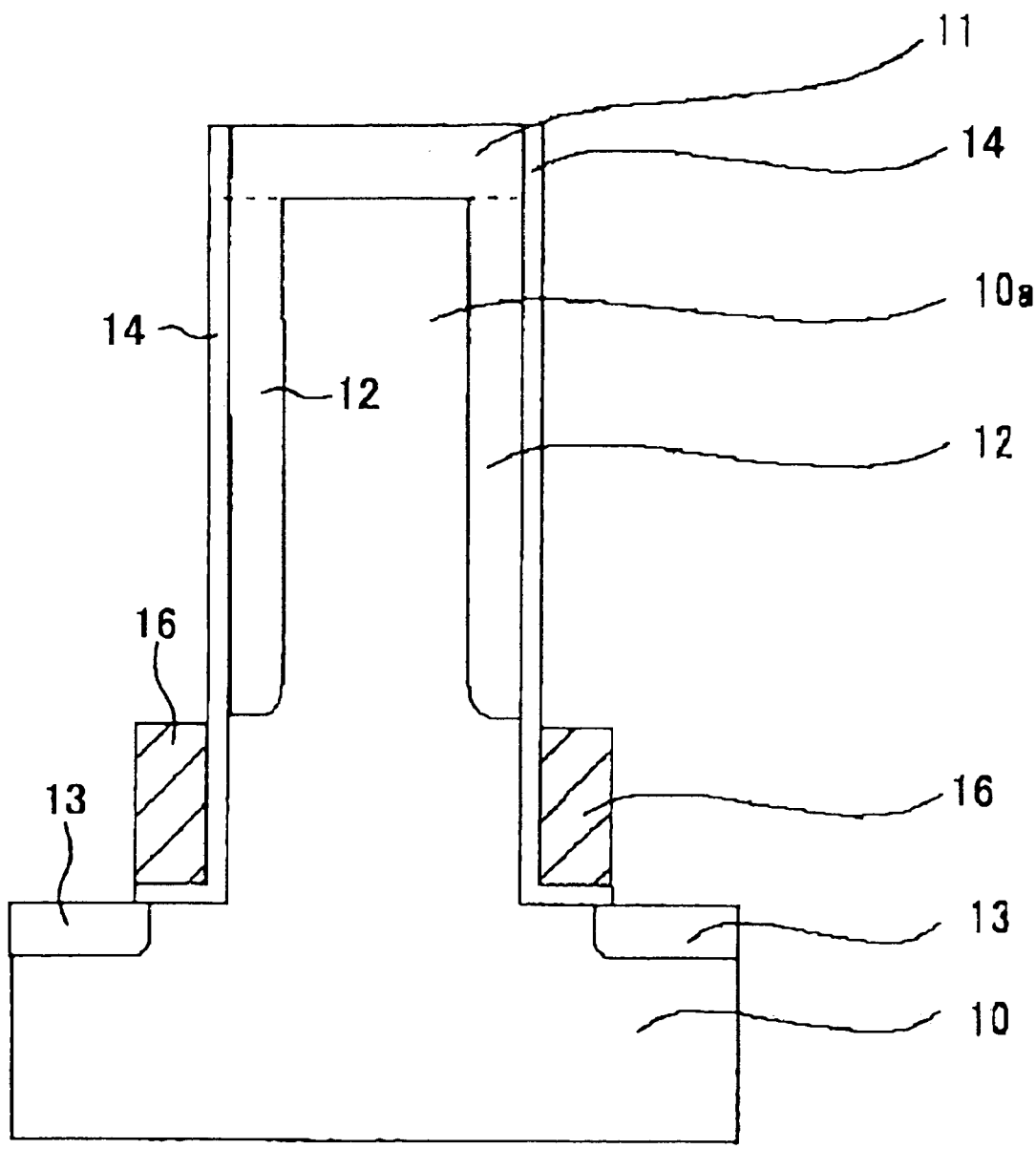
FIG. 6 is a cross sectional view illustrating a vertical CCD channel, overflow drain and photodiode forming step of the process to fabricate the solid-state image pickup apparatus.

Then, impurities are introduced to a side wall and a top portion of the protruding semiconductor layer 10a and the p-type silicon substrate 10 by, for example, an ion implantation method. In this way, as shown in FIG. 6, the vertical CCD channel 12, the overflow drain 13 and the photodiode 11 are respectively formed. For example, phosphorous or arsenic are intruded from a direction inclined by 0° to 60° at an implantation energy of 5 to 100 keV in a dose amount of about $1\times10$ to $1\times10^{17}/cm^2$. A method for implanting the impurities is not limited to the ion implantation method and can be any method as long as a desired impurity concentration can be achieved. This impurity introduction step allows introducing impurities into the vertical CCD channel 12, the overflow drain 13 and the photodiode 11 at the same time. However, introducing impurities to the vertical CCD channel 12 is a primary objective herein. Thus, it is not necessary that impurity introduction to the photodiode 11 achieve a desired impurity concentration. The impurity introduction to the overflow drain 13 may be performed before this step. Further, the impurity introduction to the polycrystalline silicon film 22 as mentioned above may also be performed at this step.

Figure 7:
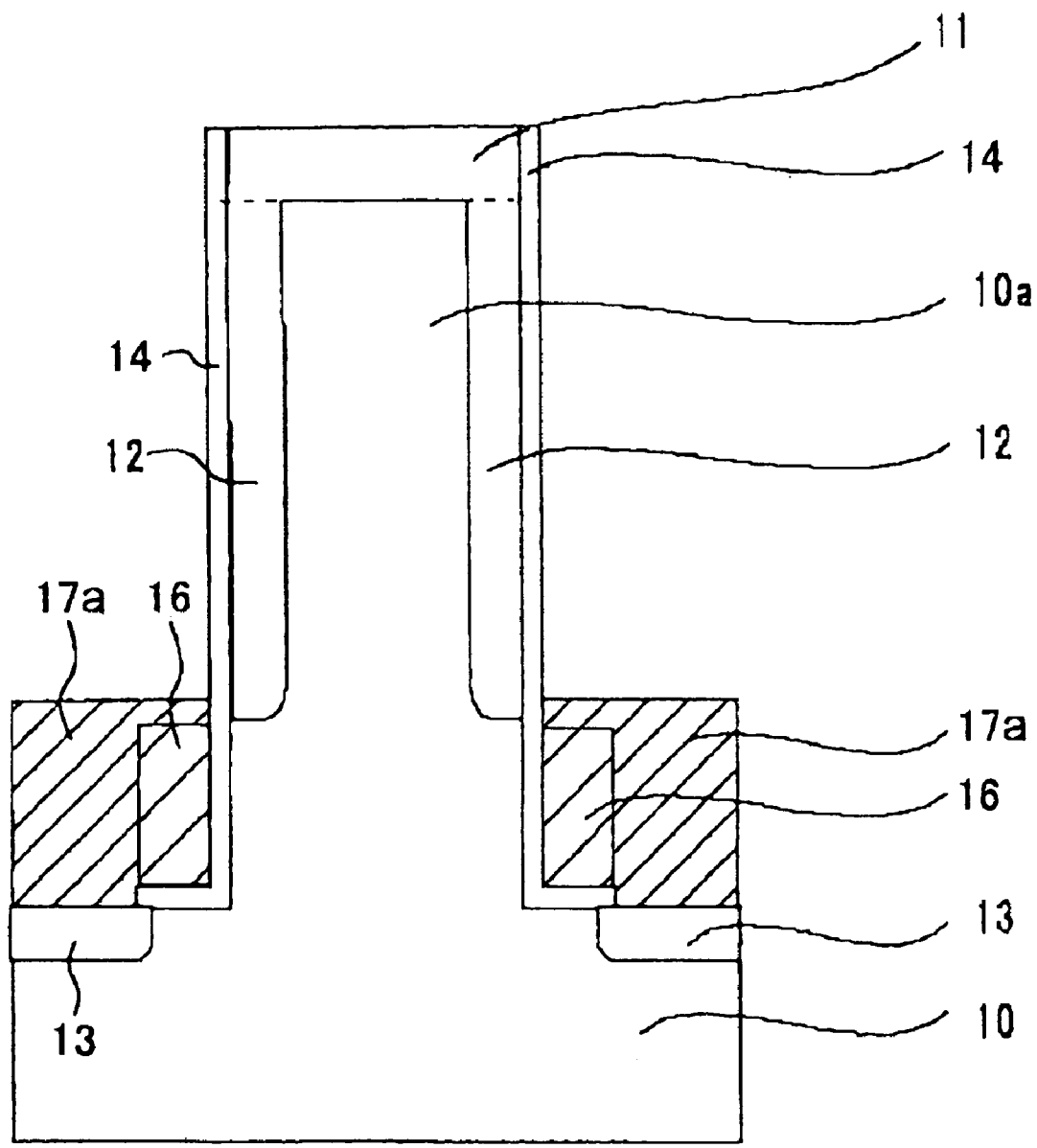
FIG. 7 is a cross sectional view illustrating an insulation film for embedding overflow potential control electrode forming step of the process to fabricate the solid-state image pickup apparatus.

Next, an insulation film is deposited by, for example, a CVD method, and etch-back is performed by an isotropic etching such as a wet etching method, to form an insulation film 17a so as to embed a polycrystalline silicon film which is to be the overflow potential control electrode 16 as shown in FIG. 7. In this step, the method is not particularly limited as long as the desired shape can be achieved.

Figure 8:
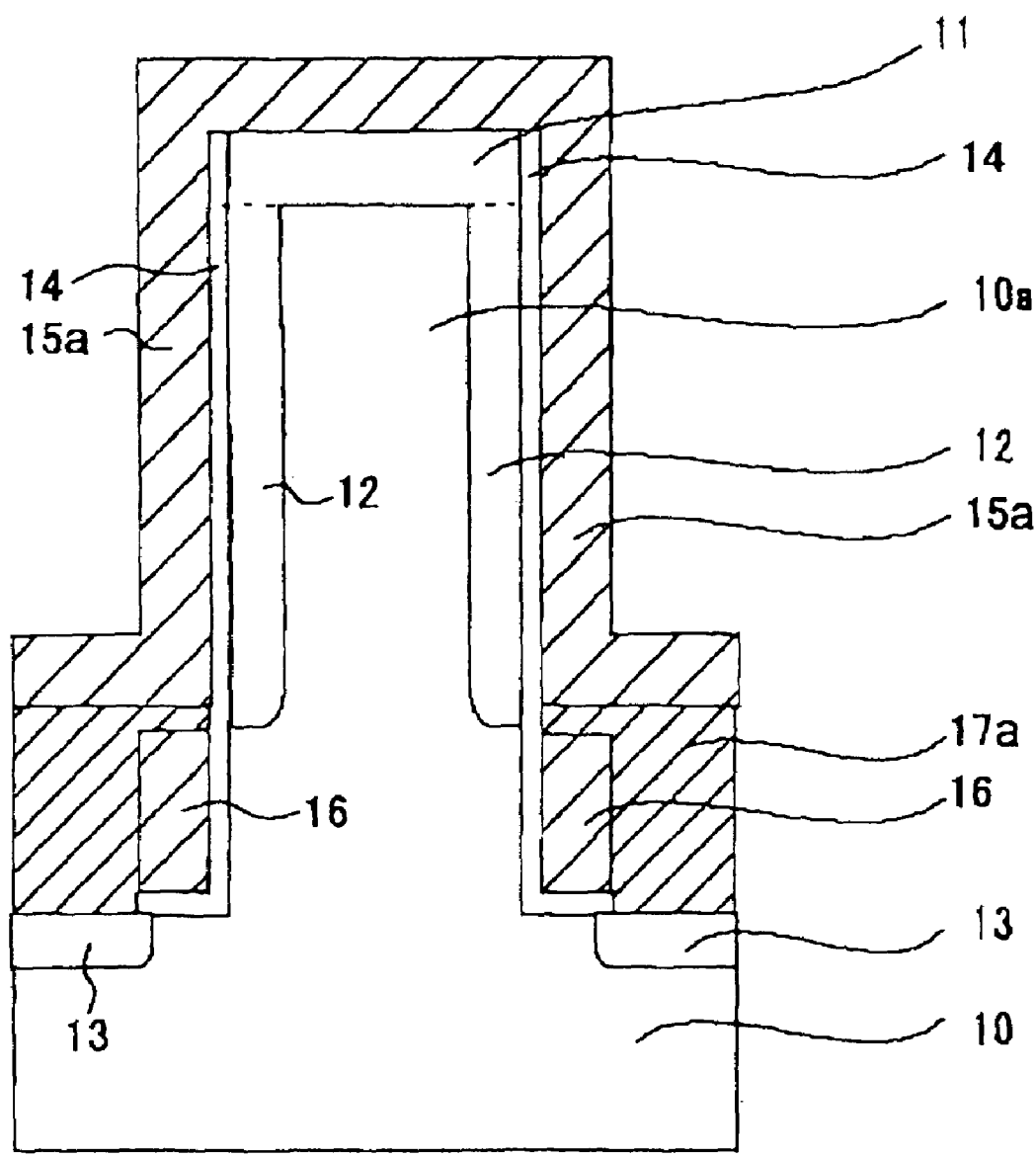
FIG. 8 to a cross sectional view illustrating an impurity introducing step after second conductive film deposition of the process to fabricate the solid-state image pickup apparatus.

Then, as shown in FIG. 8, as a second conductive film, for example, a polycrystalline silicon film 15a is deposited to have a thickness of about 20 to 200 nm. Thereafter, impurities are introduced into the polycrystalline silicon film 15a by, for example, an ion implantation method. For example, arsenic or phosphorous is introduced at an implantation energy of 5 to 100 keV in a dose amount of $1\times10^{12}$ to $1\times10^{17}/cm^2$. The method for introducing impurities to the polycrystalline silicon film 15a which is to be a second conductive film is not limited to an ion implantation method, and may be, for example, in-situ introduction (for example, impurity introduction during deposition). It is not necessary that impurities are introduced immediately after the polycrystalline silicon film 15a is deposited. It may be performed in a later process.

Figure 9:
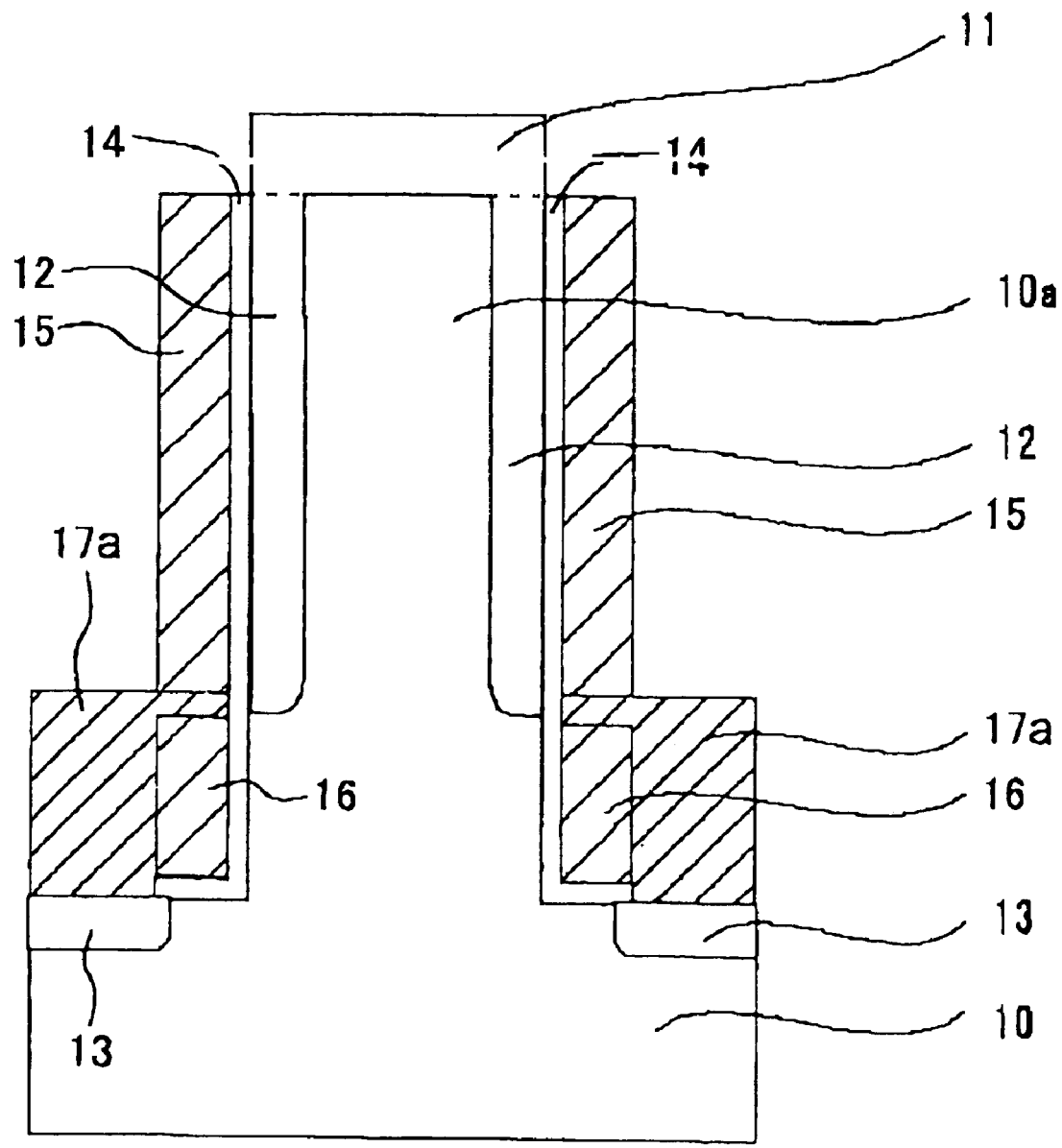
FIG. 9 is a cross sectional view illustrating a charge-transfer electrode forming step of the process to fabricate the solid-state image pickup apparatus.

Then, anisotropic etching of the polycrystalline silicon film 15a is performed by, for example, a reactive ion etching method to form the charge-transfer electrode 15 as shown in FIG. 9. The method for etching the polycrystalline silicon film 15a is not limited to an reactive ion etching method. Any method can be used as long as a desired shape is obtained. For example, a silicon oxide film, silicon nitride film or the like maybe deposited, and anisotropic etching may be performed to form a hard mask. Then, an isotropic etching method such as CDE is used to perform etching.

Figure 10:
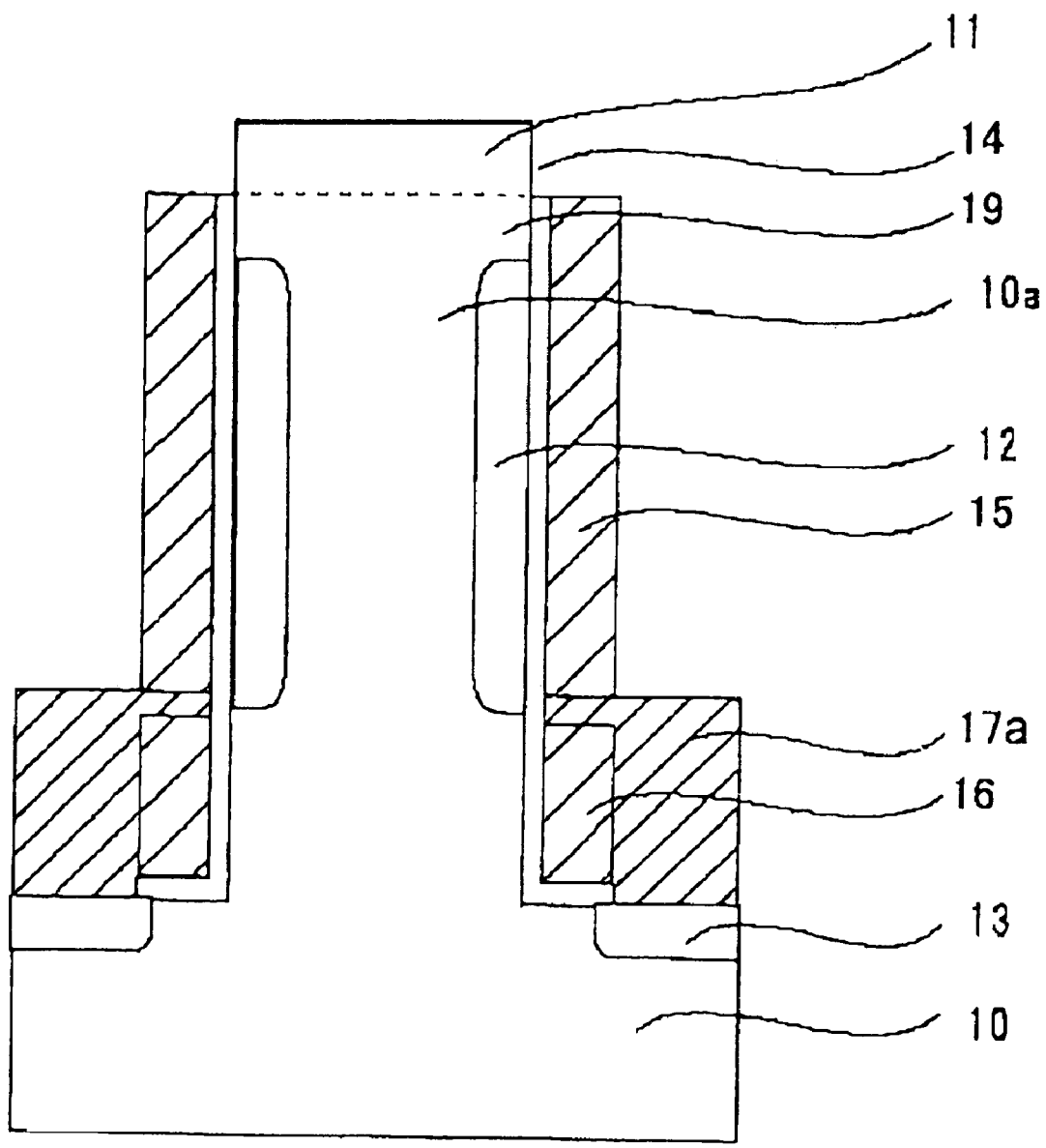
FIG. 10 is a cross sectional view illustrating a field shift gate forming step by impurity introduction and photodiode forming step by impurity introduction of the process to fabricate the solid-state image pickup apparatus.

Thereafter, impurities are introduced to a side wall of the protruding semiconductor layer 10a by, for example, an ion implantation method, and a field shift gate 19 as shown in FIG. 10 is formed. For example, arsenic is introduced from a direction inclined by 0° to 60° at an implantation energy of 5 to 100 keV in a dose amount of about $1\times10^{10}$ to $1\times10^{17}/cm^2$. The method for introducing impurities is not limited to the ion implantation method. Any method may be used as long as a desired impurity concentration distribution can be achieved.

Next, impurities are introduced to a top portion of the protruding semiconductor layer 10a by, for example, an ion implantation method, and the photodiode 11 is formed. For example, arsenic or phosphorous is introduced at an implantation energy of 5 to 100 keV in a dose amount of about $1\times10^{10}$ to $1\times10^{17}/cm^2$. The method for introducing impurities is not limited to the ion implantation method. Any method may be used as long as a desired impurity concentration distribution can be achieved.

Figure 11:
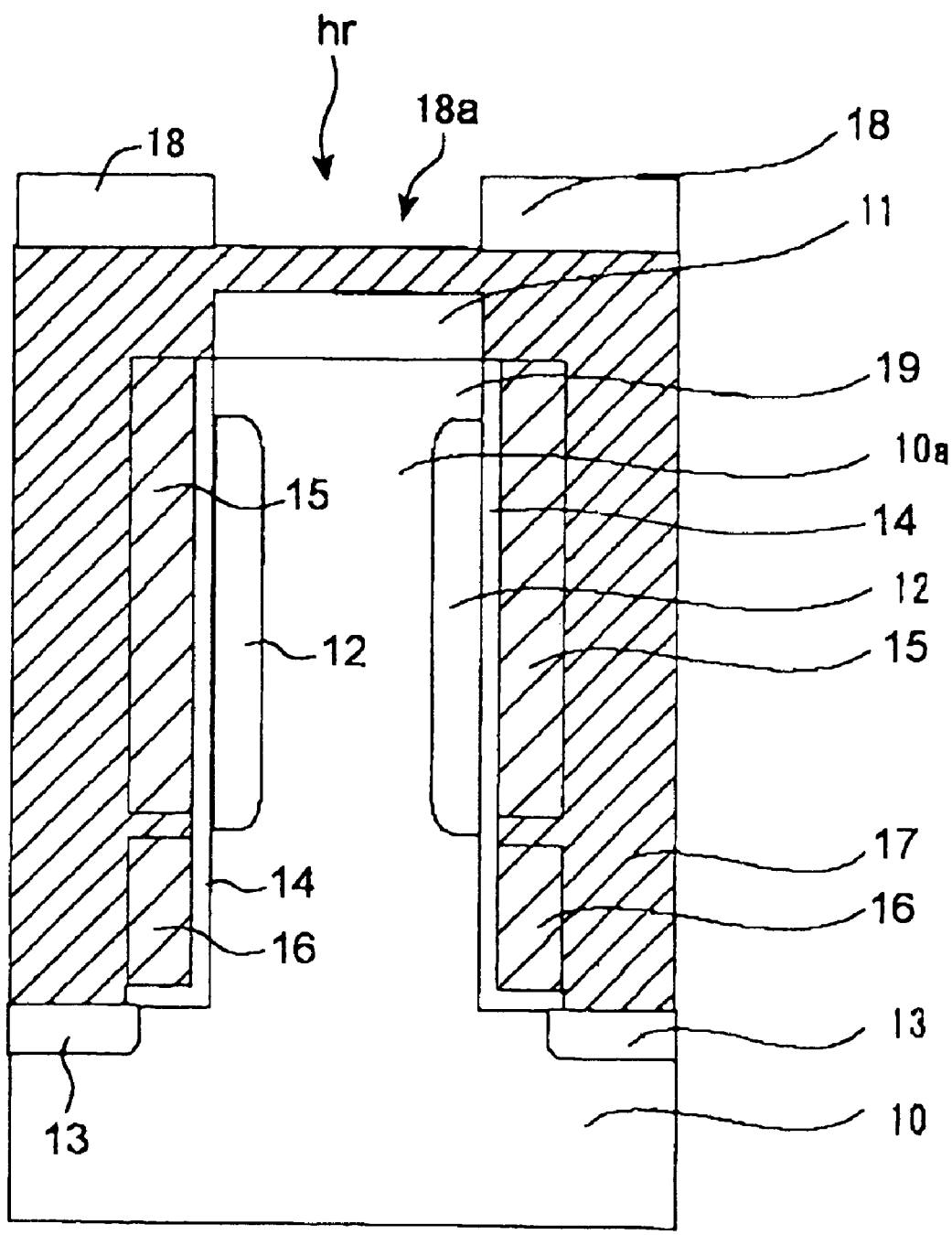
FIG. 11 is a cross sectional view illustrating an insulation film embedding process and light-shielding film opening forming step of the process to fabricate the solid-state image pickup apparatus.

Then, as shown in FIG. 11, an insulation film 17 is embedded, and a surface is planarized using a known technique. The light-shielding film 18 is deposited on an upper surface. A known photolithography technique is used for patterning and etching is performed. Thus, the opening 18a is performed on the photodiode 11.

As described above, on a semiconductor substrate such as p-type silicon substrate 10, the protruding semiconductor layer 10a is provided. On at least a part of the top portion of the protruding semiconductor layer 10a, the photodiode 11 formed of an n-type diffusion layer is provided. On at least a part of the side wall of the protruding semiconductor layer 10a, the vertical CCD channel 12 is provided. On at least a part of the vertical CCD channel 12, the gate insulation film 14 is provided by, for example, thermal oxidation. The charge-transfer electrode 15 which is formed of, for example, polycrystalline silicon, is provided so as to cover at least a part of the gate insulation film 14. On at least a part of the p-type silicon substrate 10, the overflow drain 13 is provided. On at least a part of the side wall of the protruding semiconductor layer 10a, the overflow potential control electrode 16 which is formed of polycrystalline silicon is provided via the gate insulation film 14. In this way, the solid-state image pickup apparatus 1 is fabricated. In this solid-state image pickup apparatus 1, the photodiodes 11, the vertical CCD channels 12 and the overflow drains 13 are arranged in a direction perpendicular to the surface of the p-type silicon substrate 10.

In view of the above-described structure, operations of the solid-state image pickup apparatus 1 of this embodiment will be described.

In the solid-state image pickup apparatus 1 of this embodiment, incident light hr entering from the opening 15a of the light-shielding film 18 is photoelectric converted at the photodiode 11 and stored as a signal charge. The signal charge is transported to the vertical CCD channel 12 via the field shift gate 19, and charge-transferred within the vertical CCD channel 12 sequentially.

An excess charge which is caused by strong incident light hr in the photodiode 11 passes through the field shift gate 19, the vertical CCD channel 12 and the overflow gate 20, and is discharged toward the overflow drain 13.

In the solid-state image pickup apparatus 1 of this embodiment, the vertical CCD channel 12 serves two roles of transferring the signal charge and discharging the excess charge. Thus, it is preferable that, the present embodiment has a structure of a Frame Interline type which includes a photosensitive area formed of the photodiode 11 and the like, a memory section formed of memory CCD which is adjacent to the photosensitive area, and a horizontal CCD channel and an output channel (not shown) which are connected to the vertical CCD channel 12.

With such a structure, it becomes possible to perform charge-transfer while in a vertical blanking period, and, at the same time, to use the vertical CCD channel as a discharge path for the overflow charge in a vertical valid period. Within the vertical blanking period, first, a residual charge of the vertical CCD channel is discharged, the stored charge at the photodiode 11 is read out to the vertical CCD channel, and then the signal charge is transferred from the vertical CCD channel to the memory CCD. The photodiode 11 stores a signal charge until the next vertical blanking. During this time, an excess charge caused by strong incident light hr at the photodiode 11 is transported to the vertical CCD channel 12 via the field shift gate 19. In a period other than the vertical blanking period, the signal charge of the memory CCD is read out to the vertical CCD channel, and is output through an output amplifier.

In the solid-state image pickup apparatus 1 of the present embodiment, the storage amount of the signal charge photoelectric converted by the incident light hr to the photodiode 11 can be in creased compared to the conventional structures where the photodiodes 11 and the vertical CCD channels 12 are arranged on a two dimensional plane. The reason is as follows.

The storage amount of the signal charge is determined based on an area of the vertical CCD channel 12, and a potential difference A between the vertical CCD channel 12 and the overflow drain 13. In the solid-state image pickup apparatus 1 of the present embodiment, by making the protruding semiconductor layer 10a higher, the area of the vertical CCD channel 12 can be increased without increasing an effective two dimensional area. Thus, the storage amount of the signal charge can be increased.

By arranging the photodiodes 11 and the vertical CCD channel 12 in three dimensions in a direction perpendicular to the semiconductor substrate surface the light receiving area of the photodiode 11 can be larger than that in the conventional case where the photodiodes 11 and the vertical CCD channel 12 are arranged in a two dimensional plane. Thus, it is possible to increase the light receiving area of the photodiode 11 so that photoelectric conversion can be performed even for weak incident light hr.

As described above, according to the present embodiment, the protruding semiconductor layer 10a having a convex shape is provided on the p-type silicon substrate 10, and the photodiode 11 is provided thereon. On a side wall of the protruding semiconductor layer 10a of a convex shape, the vertical CCD channel 12 and the charge-transfer electrode 15 are provided. The photodiodes 11 and the vertical CCD channels 12 are arranged three-dimensionally in a direction perpendicular to the substrate surface. Thus, it is possible to aim at increasing the light receiving area of the photodiode 11 and also increasing the area of the vertical CCD channel 12 compared to the conventional case where the photodiodes 11 and the vertical CCD channel 12 are two-dimensionally arranged on the substrate. Further, the overflow drain 13 is provided on the p-type silicon substrate 10 or the side wall of the protruding semiconductor layer 10a. The photodiode 11, the vertical CCD channel 12, and the overflow drain 13 are arranged in a direction perpendicular to the substrate surface. Thus, the excess charge can be discharged from the overflow drain 13 via the vertical CCD channel 12. Accordingly, output unevenness among the pixels can be made small and the dynamic range can be made broad. In this way, it is possible to aim at improving the image quality.

Figure 12:
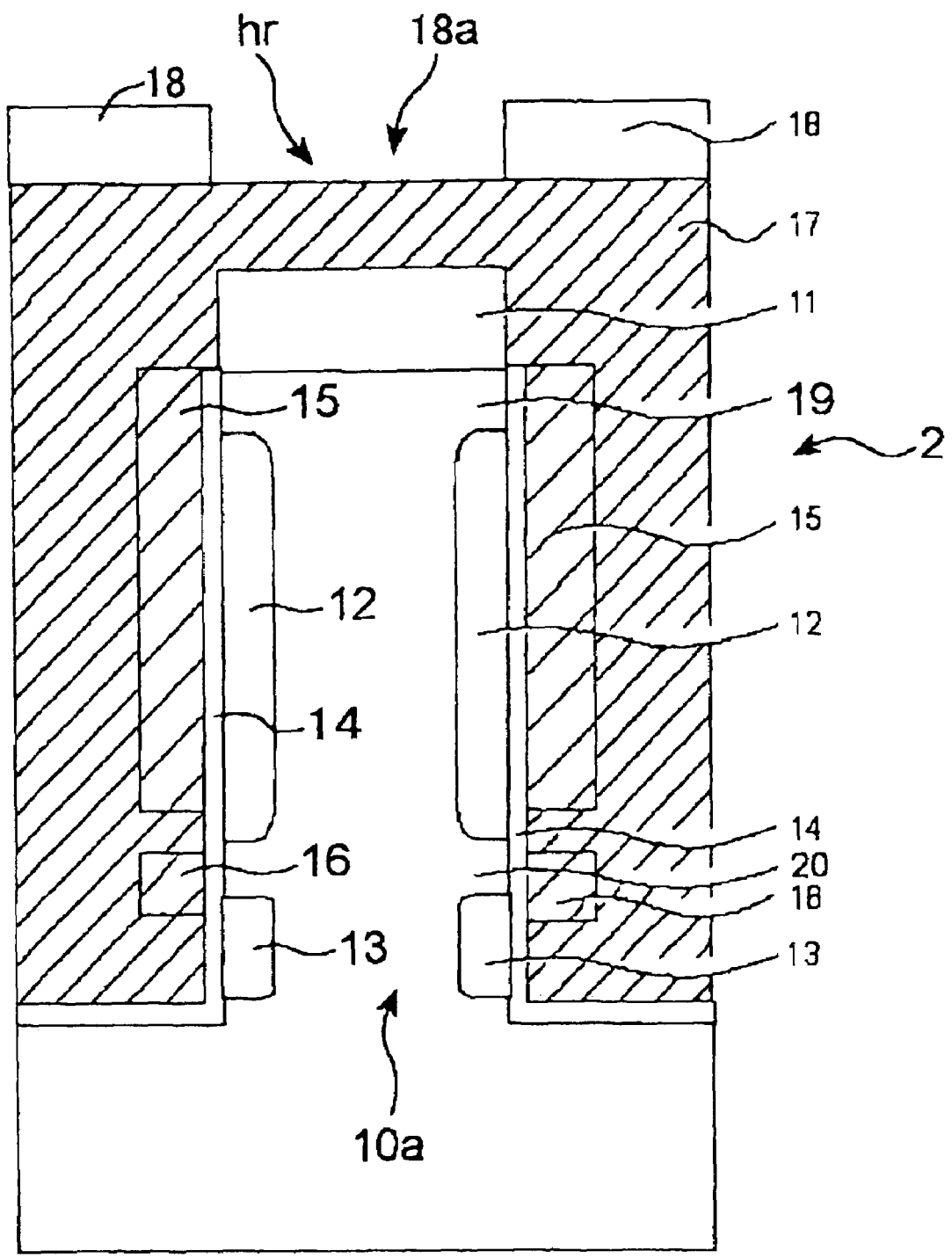
FIG. 12 is a cross sectional view showing an exemplary structure of one pixel in another embodiment of the solid-state image pickup apparatus according to the present invention.
Figure 13:
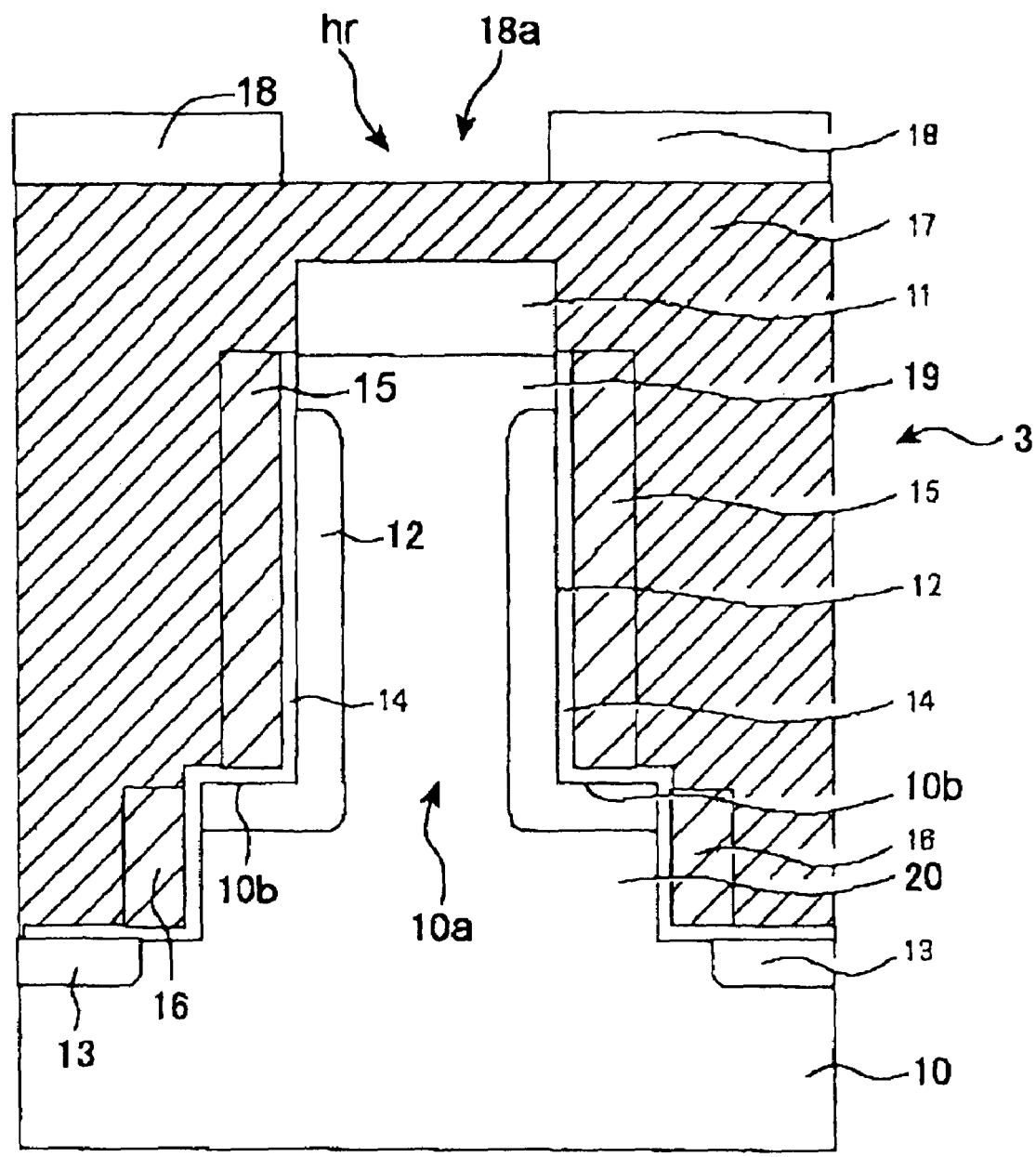
FIG. 13 is a cross sectional view showing an exemplary structure of one pixel in yet another embodiment of the solid-state image pickup apparatus according to the present invention.
Figure 14:
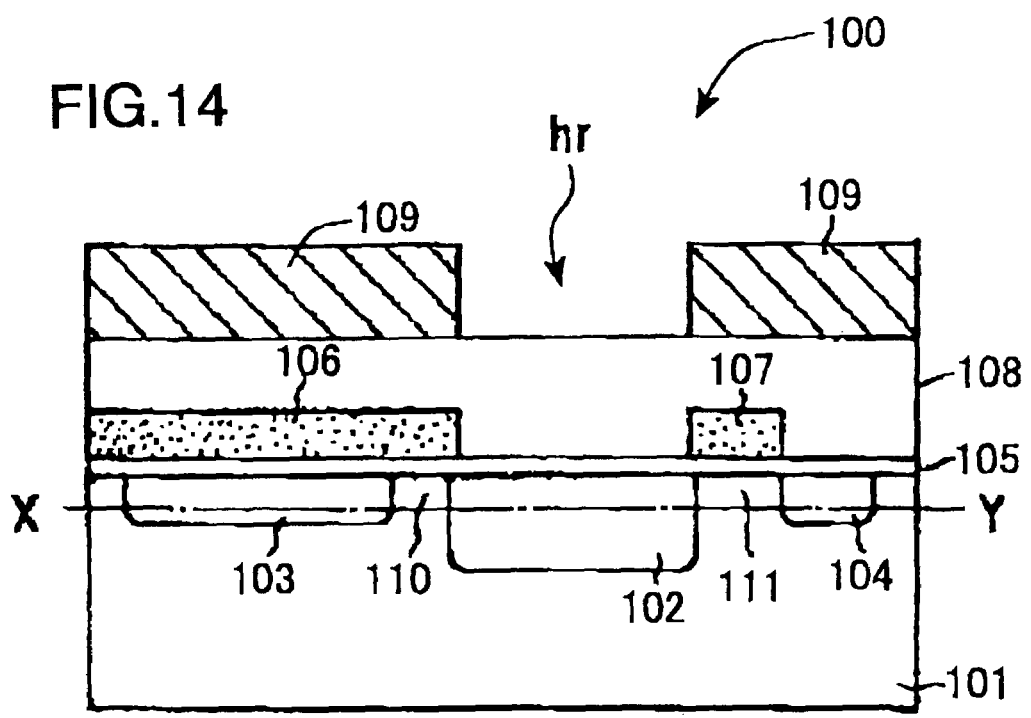
FIG. 14 is a cross sectional view showing an exemplary structure of one pixel in a conventional solid-state image pickup apparatus.
Figure 15:
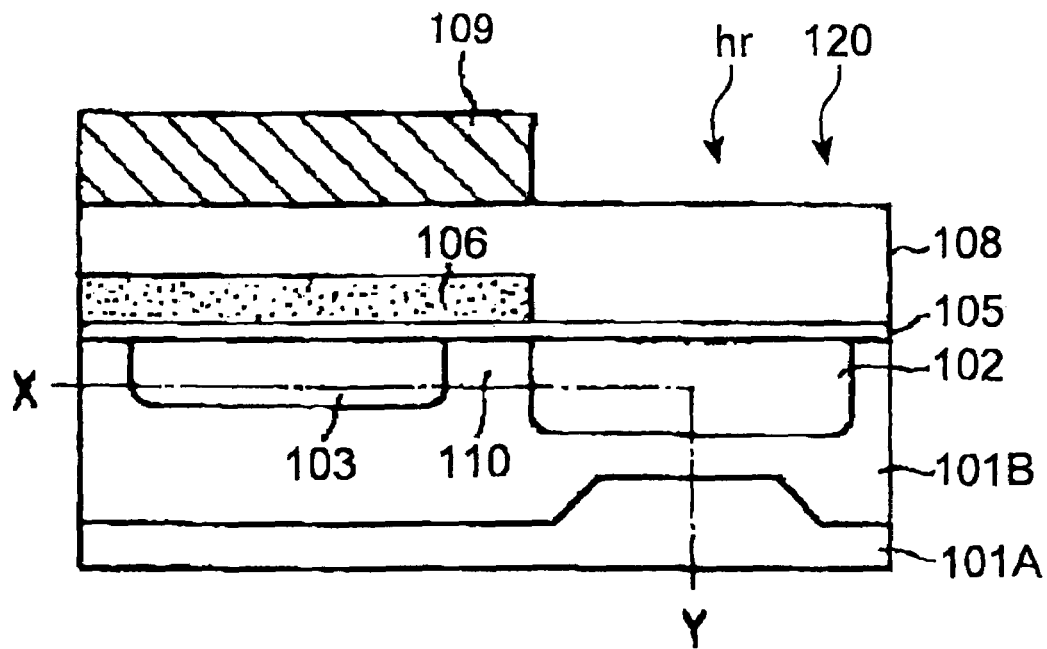
FIG. 15 is a cross sectional view showing an exemplary structure of one pixel in another conventional solid-state image pickup apparatus.
Figure 16:
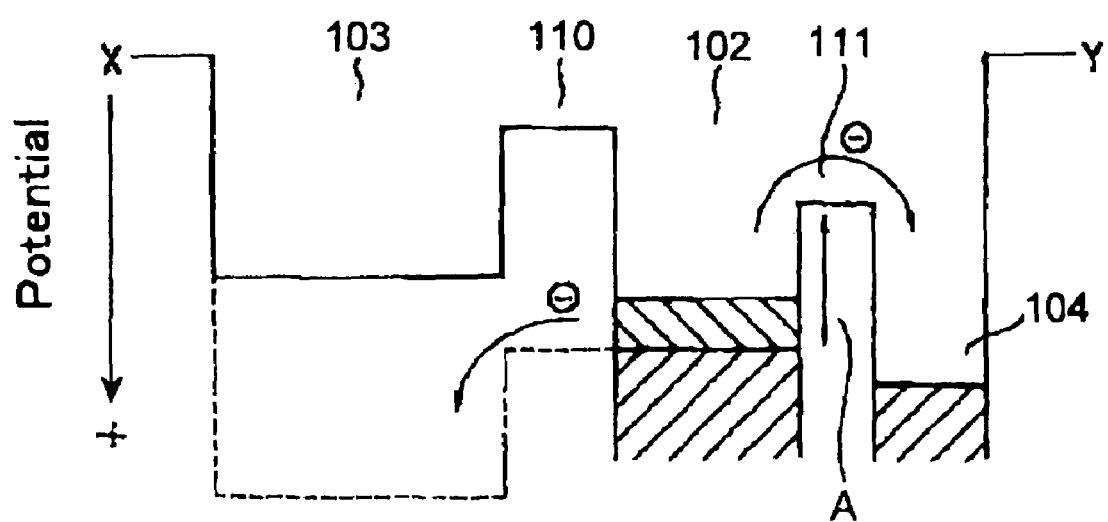
FIG. 16 is a diagram showing a potential in X-Y direction of FIG. 14.
Figure 17:
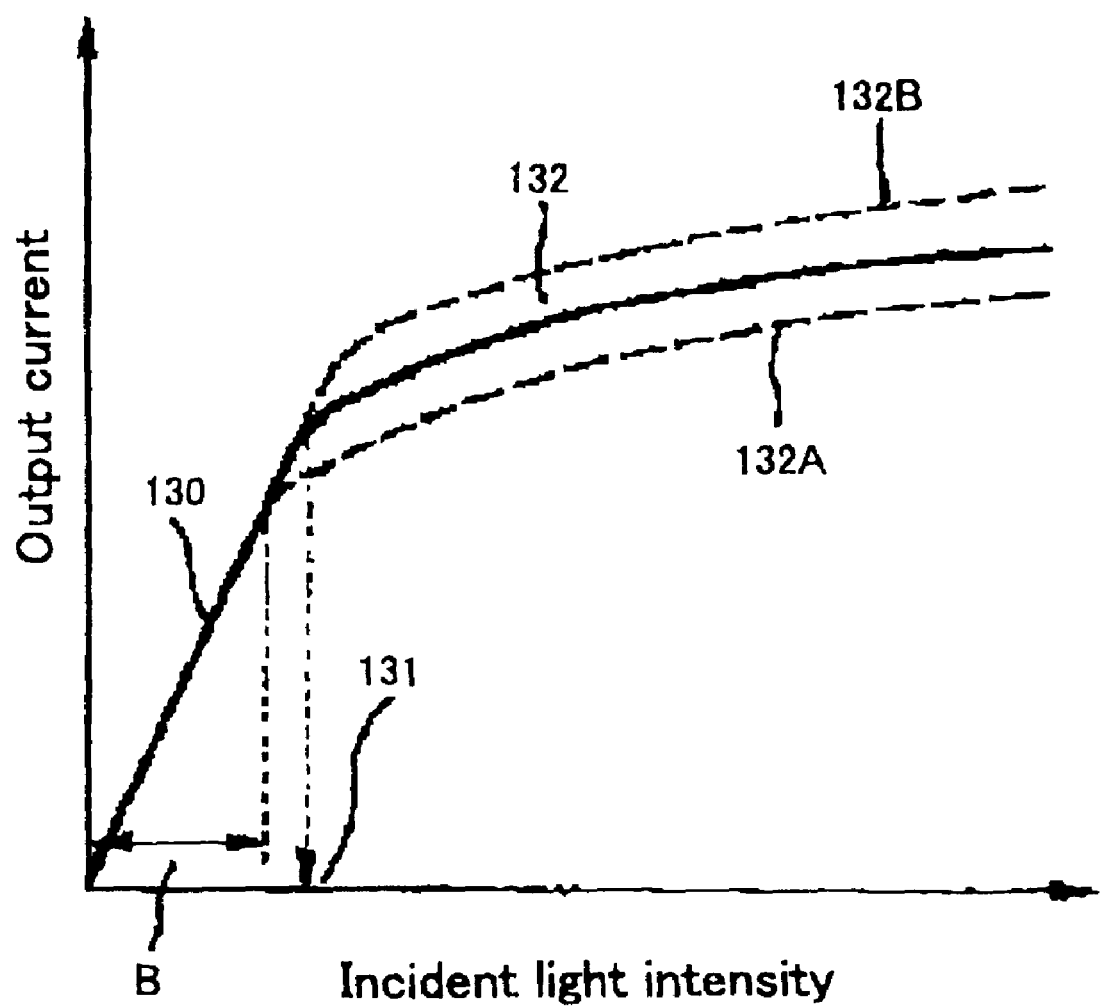
FIG. 17 is a graph showing an input/output characteristic of the pixel portion of FIG. 14.
Figure 18:
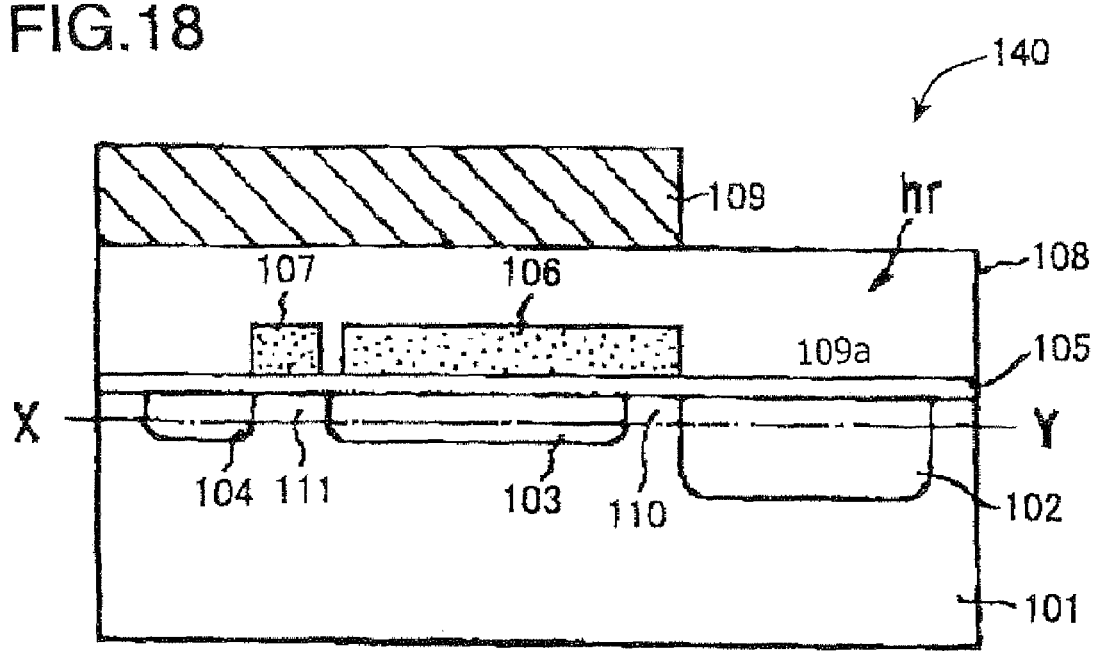
FIG. 18 is a arose sectional view showing an exemplary structure of one pixel in still another conventional solid-state image pickup apparatus.

FIG. 1 shows an example where the overflow drain 13 is provided on the p-type silicon substrate 10. However, as shown in FIG. 12, in a solid-state image pickup apparatus 2 of another embodiment, the overflow drain 13 may be provided on the side wall of the protruding semiconductor layer 10a. Further, as shown in FIG. 13, in a solid-state image pickup apparatus 3 of yet another embodiment, the charge-transfer electrode 15 and the overflow potential control electrode 16 may be formed on a side wall with a step 10b formed in the protruding semiconductor layer 10a therebetween. The structure of the solid-state image pickup apparatuses 1 to 3 of the present invention is not particularly limited as long as the photodiode 11, the charge-transfer electrode 15, the vertical CCD channel 12, and the overflow drain 13 are three-dimensionally arranged in a direction perpendicular to the semiconductor substrate surface.

Further, in the present embodiment, the protruding semiconductor layer 10a is provided to the p-type silicon substrate 10. However, the protruding semiconductor layer 10a may be provided to an n-type silicon substrate 10 and conductive types of the respective impurity diffusion layers may be reversed. The conductive types of the respective impurity diffusion layers are not particularly limited.

Further, in the present embodiment, a fabrication method of the solid-state image pickup apparatus 1 of the present invention includes the steps of: forming at least one protruding semiconductor layer 10a of a convex shape on the n-type silicon substrate 10 as a semiconductor substrate; forming an oxide film 14 on the n-type silicon substrate 10 and protruding semiconductor layer 10a; introducing predetermined impurities to a side wall portion of the protruding semiconductor layer 10a to adjust an impurity concentration of the overflow gate 20; forming the overflow potential control electrode 16 on a predetermined position on the oxide film 14; respectively forming a vertical charge-transferring section (vertical CCD channel 12), the overflow drain 13, and a region which is to be the photodiode 11 as a photoelectric converting section by ion implantation into the side wall portion of the protruding semiconductor layer 10a through the oxide film 14; embedding the overflow potential control electrode 16 with the insulation layer 17; forming the charge-transfer electrode 15 at a predetermined position on the oxide film 14 which is not buried within the insulation film 17; introducing predetermined impurities to the side wall portion of the protruding semiconductor layer 10a to form the field shift gate 19 between the vertical charge-transferring section (vertical CCD channel 12) and region which is to be the photodiode 11 as a photoelectric converting section; and introducing predetermined impurities to the top surface of the protruding semiconductor layer 10a to form the photodiode 11 as a photoelectric converting section. This method for fabricating the solid-state image pickup apparatus 1 can be simplified as follows.

The method for fabricating the solid-state image pickup apparatus 1 preferably includes the steps of: forming at least one protruding semiconductor layer having a convex shape on the semiconductor substrate; forming the vertical charge-transferring section on all or part of the side wall portion of the protruding semiconductor layer; forming the charge-transfer electrode formed of conductive film on all or part of the side wall portion of the protruding semiconductor layer; and forming the photoelectric converting section on the top surface of the protruding semiconductor layer.

The method for fabricating the solid-state image pickup apparatus 1 preferably includes the steps of: forming at least one protruding semiconductor layer of a convex shape on the semiconductor substrate; forming the overflow potential control electrode which is formed of conductive film on all or part of the side portion of the protruding semiconductor layer; forming the vertical charge-transferring section on all or part of the side wall portion of the protruding semiconductor layer; forming the overflow drain on the semiconductor substrate or protruding semiconductor layer; forming the charge-transfer electrode formed of a conductive film on all or part of side wall portion of the protruding semiconductor layer; and forming the photoelectric converting section on the top surface of the protruding semiconductor layer.

As described above, the present invention has been described with reference to the preferred embodiments of the present invention. However, the present invention should not be construed that it is limited to these embodiments. It is recognized that the scope of the present invention should be construed with reference to only the claims. It is recognized that those skilled in the art can embody an equivalent scope from the descriptions of the preferred embodiment of the present invention based on the description of the present invention and common technical knowledge. It is recognized that patents, patent applications and documents mentioned in the present specification should be herein incorporated as if the contents thereof are specifically described in the present specification.

In the field of CCD-type solid-state image pickup apparatuses used in image taking sections of, for example, video cameras, digital still cameras, camera-equipped cell phones, and digital electric appliances, and methods for fabricating the same, the present invention increases a light receiving area of a photodiode to increase a incident light intensity, and, at the same time, increases an area of a vertical CCD channel to increase storage amount of signal charge. Thus, a solid-state image pickup apparatus with improved image quality can be achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image pickup apparatus, comprising:
   one or a plurality of photoelectric converting sections provided on a semiconductor substrate for photoelectric converting incident light into a signal charge; and
   a vertical charge-transferring section for charge-transferring the signal charge photoelectric converted and stored at the photoelectric converting section,
   wherein the vertical charge-transferring section is arranged along the arrangement of the one or a plurality of photoelectric converting sections aligned in a perpendicular direction such that the vertical charge-transferring section is under the photoelectric converting section on a side of the semiconductor substrate in which at least a portion of the photoelectric converting portion overlaps in a vertical dimension with at least a portion of the vertical charge-transferring portion.

2. A solid-state image pickup apparatus according to claim 1, further comprising at least one protruding semiconductor layer of a convex shape provided on the semiconductor substrate,
   wherein the vertical charge-transferring section is provided on all or part of a side wall of the protruding semiconductor layer, and
   the photoelectric converting section is provided on a top surface of the protruding semiconductor layer.

3. A solid-state image pickup apparatus according to claim 2, further comprising an overflow drain provided in the vertical charge-transferring section on the side of the semiconductor substrate,
   wherein the overflow drain is configured to discharge an excess charge generated at the photoelectric converting section via the vertical charge-transferring section.

4. A solid-state image pickup apparatus according to claim 3, wherein the overflow drain is provided on at least one of a top surface of the semiconductor substrate and a side wail of the protruding semiconductor layer.

5. A solid-state image pickup apparatus according to claim 3, further comprising:
   a charge-transfer electrode for controlling charge-transfer of the vertical charge-transferring section, which is provided over the vertical charge-transferring section and a region between the vertical charge-transferring section and the photoelectric converting section with an insulation film interposed therebetween; and an overflow potential control electrode for controlling charge discharging to the overflow drain, which is provided over a region between the vertical charge-transferring section and the overflow drain with an insulation film interposed therebetween.

6. A solid-state image pickup apparatus according to claim 5, wherein the side wall of the protruding semiconductor layer has a step, and the charge-transfer electrode and the overflow potential control electrode are respectively provided on the side wall having the step.

7. A solid-state image pickup apparatus according to claim 1, wherein the vertical charge-transferring section is located along a direction of a plurality of the photoelectric converting sections which are aligned in a vertical direction.

8. A method for fabricating a solid-state image pickup apparatus, the solid-state image pickup apparatus including a plurality of photoelectric converting sections provided on a semiconductor substrate for photoelectric converting incident light into a signal charge; and a vertical charge-transferring section arranged along arrangement of the plurality of photoelectric converting sections aligned in a perpendicular direction such that the vertical charge-transferring section is located under the photoelectric converting sections on the side of the semiconductor substrate for charge-transferring the signal charge photoelectric converted and stored at the photoelectric converting sections in which at least a portion of the photoelectric converting portion overlaps in a vertical dimension with at least a portion of the vertical charge-transferring portion, the method comprising the steps of:

forming at least one protruding semiconductor layer of a convex shape on the semiconductor substrate;

forming a vertical charge-transferring section on all or part of a side wall of the protruding semiconductor layer;

forming a charge-transfer electrode which is formed of a conductive film on all or part of the side wall of the protruding semiconductor layer; and forming the photoelectric converting sections on a top surface of the protruding semiconductor layer.

9. A method for fabricating a solid-state image pickup apparatus, the solid-state image pickup apparatus including a plurality of photoelectric converting sections provided on a semiconductor substrate for photoelectric converting incident light into a signal charge; a vertical charge-transferring section arranged along the along arrangement of the plurality of photoelectric converting sections aligned in a perpendicular direction such that the vertical charge-transferring section is located under the photoelectric converting sections on the side of the semiconductor substrate for charge-transferring the signal charge photoelectric converted and stored at the photoelectric converting sections in which at least a portion of the photoelectric converting portion overlaps in a vertical dimension with at least a portion of the vertical charge-transferring portion; and an overflow drain located in the vertical charge-transferring section on the side of the semiconductor substrate, wherein the overflow drain is configured to discharge an excess charge generated at the photoelectric converting section via the vertical charge-transferring section, the method comprising the steps of:

forming at least one protruding semiconductor layer of a convex shape on the semiconductor substrate;

forming an overflow potential control electrode which is formed of a conductive film on all or part of a side wall of the protruding semiconductor layer;

forming a vertical charge-transferring section on all or part of the side wall of the protruding semiconductor layer;

forming the overflow drain on the semiconductor substrate or the protruding semiconductor layer;

forming a charge-transfer electrode which is formed of a conductive film on all or part of the side wall of the protruding semiconductor layer; and forming the photoelectric converting sections on a top surface of the protruding semiconductor layer.

10. A method for fabricating a solid-state image pickup apparatus, the solid-state image pickup apparatus including a plurality of photoelectric converting sections provided on a semiconductor substrate for photoelectric converting incident light into a signal charge;

a vertical charge-transferring section arranged along the arrangement of the plurality photoelectric converting sections aligned along the arrangement of direction such that the vertical charge-transferring section is located under the photoelectric converting sections on the side of the semiconductor substrate for charge-transferring the signal charge photoelectric converted and stored at the photoelectric converting sections in which at least a portion of the photoelectric converting portion overlaps in a vertical dimension with at least a portion of the vertical charge-transferring portion; and an overflow drain located in the vertical charge-transferring section on the side of the semiconductor substrate, wherein the overflow drain is configured to discharge an excess charge generated at the photoelectric converting section via the vertical charge-transferring section, the method comprising the steps of:

forming at least one protruding semiconductor layer of a convex shape on the semiconductor substrate;

forming an oxide film on the semiconductor substrate and protruding semiconductor layer;

introducing predetermined impurities to a side wall of the protruding semiconductor layer to adjust an impurity concentration of an overflow gate portion;

forming an overflow potential control electrode at a predetermined position on the oxide film;

respectively forming the vertical charge-transferring section, the overflow drain, and a region to be photoelectric converting sections by ion implantation to the side wall of the protruding semiconductor layer through the oxide film;

embedding the overflow potential control electrode with the insulation film;

forming a charge-transfer electrode at a predetermined position on the oxide film which is not buried by the insulation film;

introducing predetermined impurities on the side wall of the protruding semiconductor layer to form a field shift gate in a region between the vertical charge-transferring section and the region to be photoelectric converting sections; and introducing predetermined impurities to a top surface of the protruding semiconductor layer to form the photoelectric converting sections.

* * * * *